(12) United States Patent
Chen et al.

(10) Patent No.: US 10,103,051 B2
(45) Date of Patent: Oct. 16, 2018

(54) SEMICONDUCTOR STRUCTURE HAVING AN ISOLATION LAYER FOR REDUCING PARASITIC EFFECT

(71) Applicant: RichWave Technology Corp., Taipei (TW)

(72) Inventors: Chih-Sheng Chen, Taipei (TW); Jhao-Yi Lin, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

(21) Appl. No.: 15/603,480

(22) Filed: May 24, 2017

(65) Prior Publication Data

US 2018/0025935 A1  Jan. 25, 2018

(30) Foreign Application Priority Data

Jul. 22, 2016 (TW) .............................. 105123123 A

(51) Int. Cl.
| | | |
|---|---|---|
| H01L 21/76 | (2006.01) | |
| H01L 21/762 | (2006.01) | |
| H01L 29/06 | (2006.01) | |
| H01L 21/765 | (2006.01) | |
| H01L 27/082 | (2006.01) | |
| H01L 27/092 | (2006.01) | |
| H01L 29/735 | (2006.01) | |

(52) U.S. Cl.
CPC ...... *H01L 21/76224* (2013.01); *H01L 21/765* (2013.01); *H01L 29/0619* (2013.01); *H01L 27/082* (2013.01); *H01L 27/0928* (2013.01); *H01L 29/735* (2013.01)

(58) Field of Classification Search
CPC ................................................... H01L 29/7816
See application file for complete search history.

(56) References Cited

U.S. PATENT DOCUMENTS

| | | | | |
|---|---|---|---|---|
| 9,543,454 | B1* | 1/2017 | Lin | ........................ H01L 29/866 |
| 2003/0197242 | A1* | 10/2003 | Chen | ............... H01L 21/823878 |
| | | | | 257/509 |
| 2008/0191277 | A1* | 8/2008 | Disney | ................ H01L 29/0638 |
| | | | | 257/343 |
| 2008/0290452 | A1 | 11/2008 | Williams | |
| 2010/0127318 | A1 | 5/2010 | Noort | |
| 2014/0035035 | A1 | 2/2014 | Huo | |
| 2016/0372592 | A1* | 12/2016 | Cho | .................... H01L 29/7816 |

FOREIGN PATENT DOCUMENTS

| | | |
|---|---|---|
| TW | I322504 | 3/2010 |
| TW | I399855 | 6/2013 |

* cited by examiner

*Primary Examiner* — Fernando L Toledo
*Assistant Examiner* — Valerie N Newton
(74) *Attorney, Agent, or Firm* — Winston Hsu

(57) ABSTRACT

A semiconductor structure includes a first well, a semiconductor element, a second well and a first isolation layer. The semiconductor element is formed on or contacts the first well. The first well is formed on the second well. The first isolation layer is used to reduce a parasitic effect between the first well and the second well. The bottom of the first isolation layer is at least as deep as the bottom of the first well. The first isolation layer substantially forms a first ring structure around the first well. The doping type of the second well is different from the doping type of the first well.

17 Claims, 10 Drawing Sheets

SEMICONDUCTOR STRUCTURE HAVING AN ISOLATION LAYER FOR REDUCING PARASITIC EFFECT

TECHNICAL FIELD

The present invention is related to a semiconductor structure, and in particular, a semiconductor structure including an isolation layer to reduce a parasitic effect.

BACKGROUND

With increasing use of high-frequency application, parasitic effects with parasitic resistance and capacitance generated by high-frequency operation have become more significant in the field of semiconductor process. For example, a complementary metal-oxide-semiconductor (CMOS) device of single well is formed on a signal well that is disposed on a substrate, and the CMOS device of single well may be interfered by a parasitic effect between the well and the substrate when operating at a high-frequency. In order to deal with the problem, a solution of multi-well may be used to form a semiconductor element. For example, a transistor of triple-well has been used. An improved isolation effect is provided by using multiple wells. However, for applications of higher frequencies such as radio frequency (RF) applications, unwanted parasitic effects are more significant and yet difficult to avoid. Hence, a solution is required to reduce parasitic effects of semiconductor elements in the field.

SUMMARY

An embodiment of the present invention provides a semiconductor structure. The semiconductor structure includes a first well, a semiconductor element, a second well and a first isolation layer. The semiconductor element is formed on or contacts the first well. The first well is formed on the second well. The first isolation layer is used to reduce a parasitic effect between the first well and the second well. The bottom of the first isolation layer is at least as deep as the bottom of the first well. The first isolation layer substantially forms a first ring structure around the first well. The doping type of the second well is different from the doping type of the first well.

Another embodiment of the present invention provides a semiconductor structure. The semiconductor structure includes a first well, a semiconductor element, a second well, a heavily-doped region, and a second isolation layer. The semiconductor element is formed on or contacts the first well. The first well is formed on the second well. The heavily-doped region is formed on the first well, and between the semiconductor element and a side edge of the first well. The second isolation layer is used to reduce a parasitic effect between the heavily-doped region and the semiconductor element, and form a second ring structure. The bottom of the second isolation layer is at least as deep as the bottom of the first well. The second ring structure has at least one opening. The doping type of the second well is different from the doping type of the first well.

DETAILED DESCRIPTION

Figure 1:
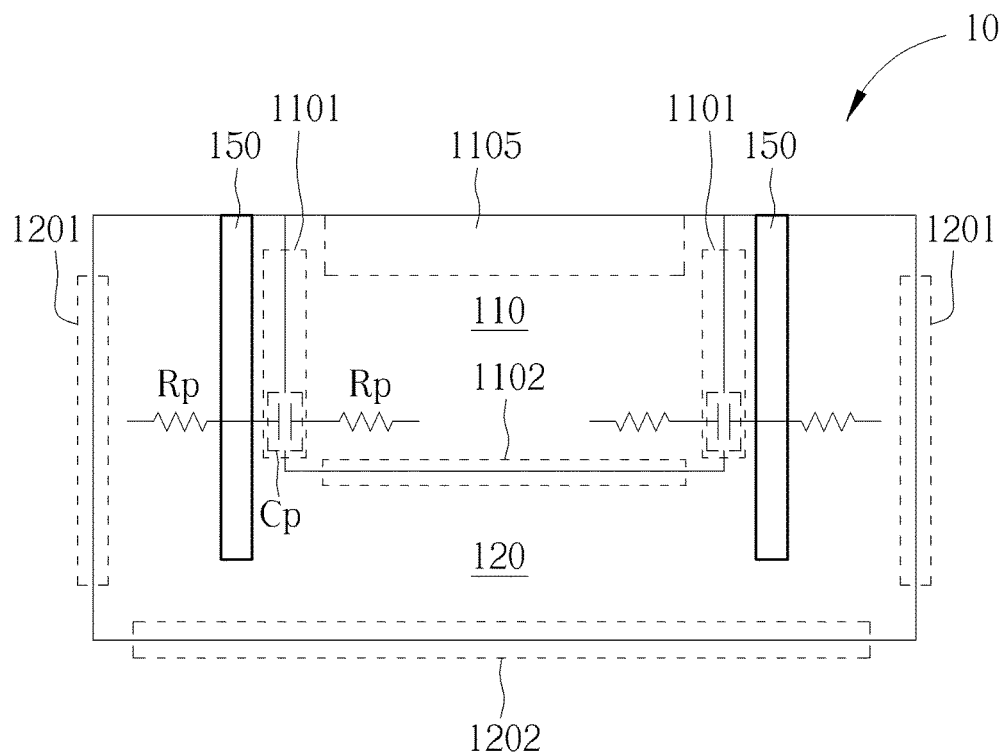
FIG. 1 illustrates a section view of a semiconductor structure according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a section view of a semiconductor structure according to an embodiment of the present invention. The semiconductor structure 10 may include a first well 110, a semiconductor element 1105, a second well 120 and an isolation layer 150. The semiconductor element 1105 may be formed on or contact the well 110. According to an embodiment, when the semiconductor element 1105 contacts the well 110, the semiconductor element 1105 may have a portion formed outside the well 110, and another portion contacting the well 110. According to an embodiment shown in FIG. 1, the semiconductor element 1105 may be formed on the well 110. The well 110 may be formed on the well 120. The isolation layer 150 may be used to reduce a parasitic effect between the well 110 and the well 120. The semiconductor element 1105 may be an active element or a passive element such as one comprising a capacitor, an inductor, a diode and/or a transistor. The well 120 may be formed outside of the well 110. A side edge 1101 and a bottom edge 1102 may be formed between the well 110 and the well 120. A side edge 1201 and a bottom edge 1202 may be formed on the boundary of the well 120. A bottom of the isolation layer 150 may be at least as deep as the bottom edge 1102. Hence, the bottom of the isolation layer 150 may be as deep as the bottom of the well 110 or even deeper, so the isolation layer 150 may be formed to be deeper than using an STI (shallow trench isolation) process. The isolation layer 150 may substantially form a ring structure around the well 110. The isolation layer 150 may substantially form the ring structure around the well 110 along the side edge 1101 according to the embodiment of FIG. 1, and the ring structure may be continuous or discontinuous. The doping type of the well 120 may be different from the doping type of the well 110. For example, when the well 110 is of a p-type doping, the well 120 may be of an n-type doping; and when the well 110 is of an n-type doping, the well 120 may be of a p-type doping.

Since the doping types of the wells 110 and 120 may be different, a parasitic effect may occur between the wells 110 and 120. As show in FIG. 1, a parasitic capacitance Cp may exist on the boundary between the wells 110 and 120, and parasitic resistances Rp may be generated. By disposing the isolation layer 150, the parasitic effect between the wells 110 and 120 may be effectively inhibited by isolating the well 110 and the well 120. According to an embodiment of the present invention, the bottom of the isolation layer 150 may be slightly shallower than the bottom of the well 120. In this condition, the bottom of the isolation layer 150 may be much deeper than the bottom edge 1102 so that the effect of isolation may be sufficient.

Figure 2:
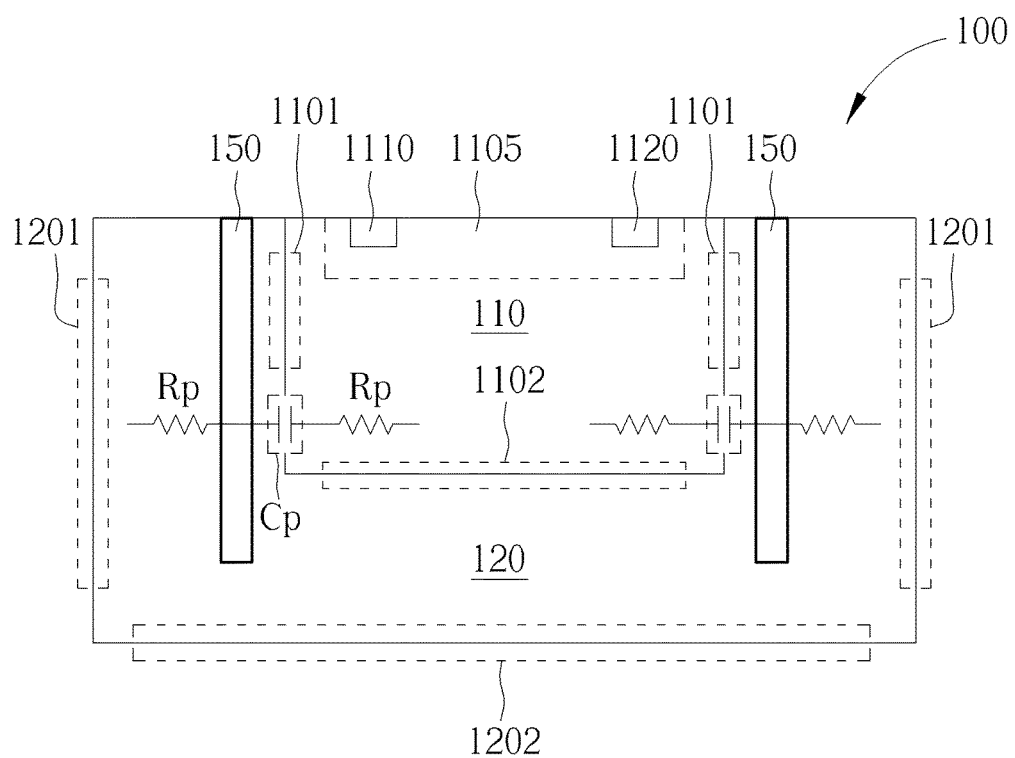
FIG. 2 illustrates a section view of a semiconductor structure according to an embodiment of the present invention.

FIG. 2 illustrates a section view of a semiconductor structure 100 according to an embodiment of the present invention. Comparing with the semiconductor structure 10, the semiconductor structure 100 may further include a first doped region 1110 and a second doped region 1120. The doped regions 1110 and 1120 may be formed on the well 110, and used to form the semiconductor element 1105 with the well 110. According to an embodiment of the present invention, the semiconductor element 1105 may be a transistor. For example, when the doped regions 1110 and 1120 are of an n-type doping, and the well 110 is of a p-type doping, the well 110 and the doped regions 1110-1120 may form an npn transistor. In another example, when the doped regions 1110 and 1120 are of a p-type doping, and the well 110 is of an n-type doping, the well 110 and the doped regions 1110-1120 may form a pnp transistor.

Figure 3:
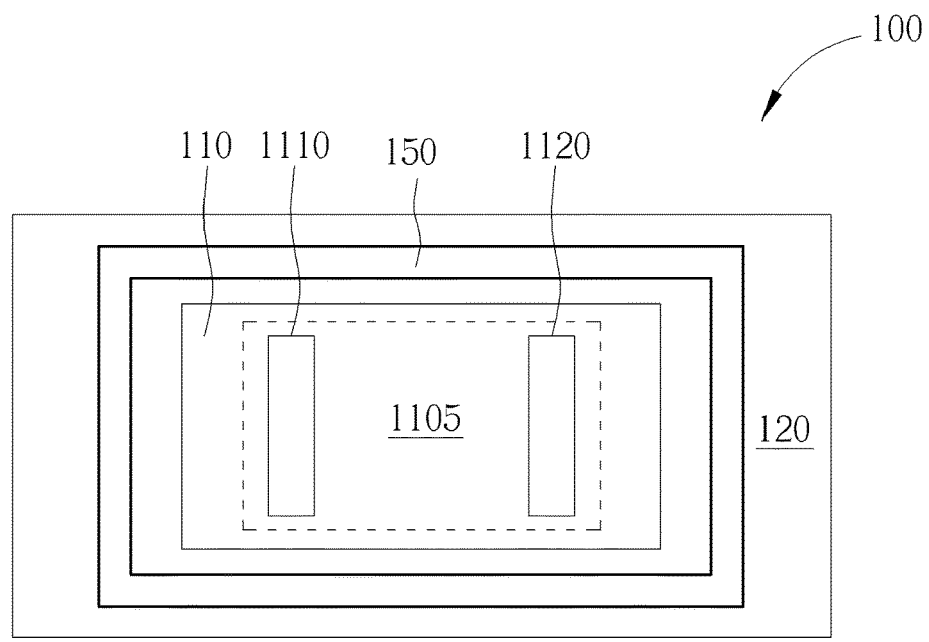
FIG. 3 illustrates a layout diagram of the semiconductor structure of FIG. 2.

FIG. 3 illustrates a layout diagram of the semiconductor structure 100 of FIG. 2. FIG. 3 may show a top view of place-and-route (P&R) diagram corresponding to FIG. 2. In FIG. 3, the continuous ring structure of the isolation layer 150 may be seen.

Figure 4:
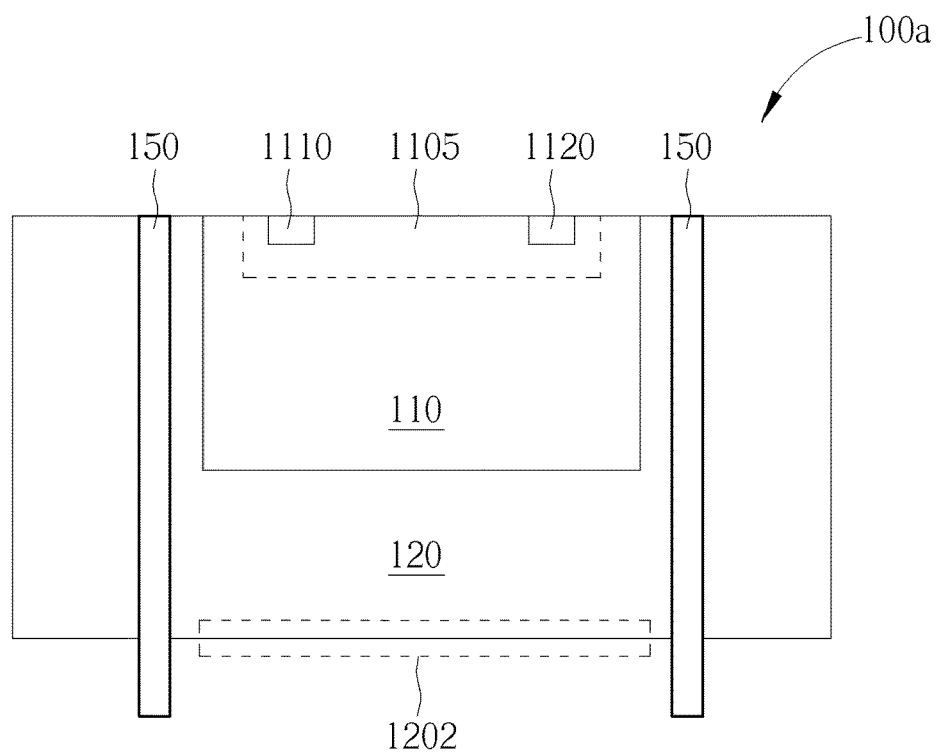
FIG. 4 illustrates a section view of a semiconductor structure according to an embodiment of the present invention.
Figure 5:
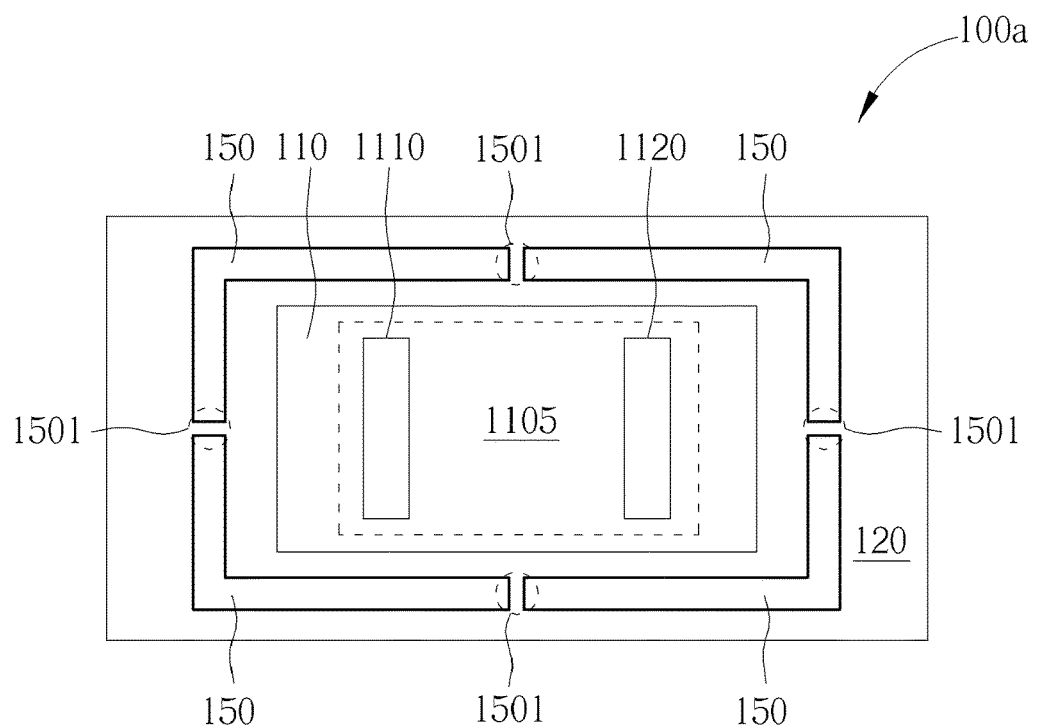
FIG. 5 illustrates a layout diagram of the semiconductor structure of FIG. 4.

FIG. 4 illustrates a section view of a semiconductor structure 100a according to an embodiment of the present invention. FIG. 5 illustrates a layout diagram of the semiconductor structure 100a of FIG. 4. According to an embodiment of the present invention, the bottom of the isolation layer 150 may be as deep as the bottom edge 1202 of the well 120, or even deeper, as shown in FIG. 4. Similar to FIG. 3, the isolation layer 150 shown in FIG. 5 may form a ring structure. However the ring structure of the isolation layer 150 in FIG. 5 may be discontinuous and with M openings 1501. M is a positive integer. The opening 1501 may break the ring structure completely or partially to provide a path for applying a reverse bias voltage. For example, when the well 110 is of a p-type doping and the well 120 is of an n-type doping, a lower voltage may be applied to the well 110, and a higher voltage may be applied to the well 120. This is to have a reverse bias voltage that may inhibit the parasitic effect between the well 110 and the well 120. When the bottom of the isolation layer 150 is as deep as or deeper than the bottom edge 1202, the ring structure of the isolation layer 150 may be deigned to have the M openings 1501 for applying the reverse bias voltage from an external source.

Figure 6:
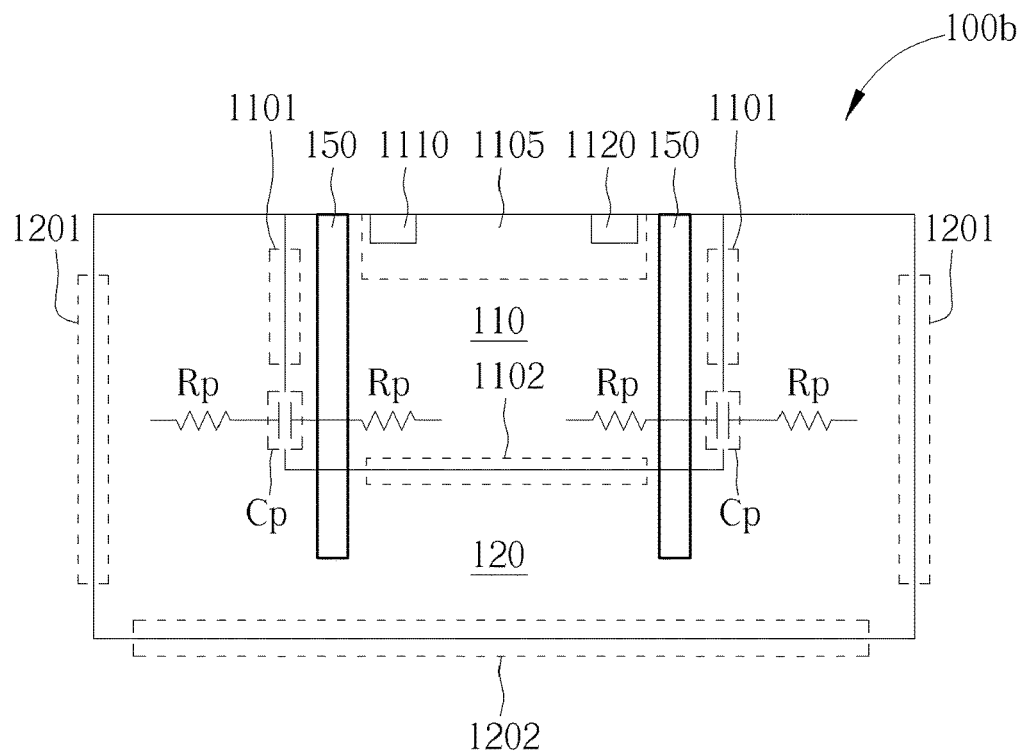
FIG. 6 illustrates a section view of a semiconductor structure according to an embodiment of the present invention.
Figure 7:
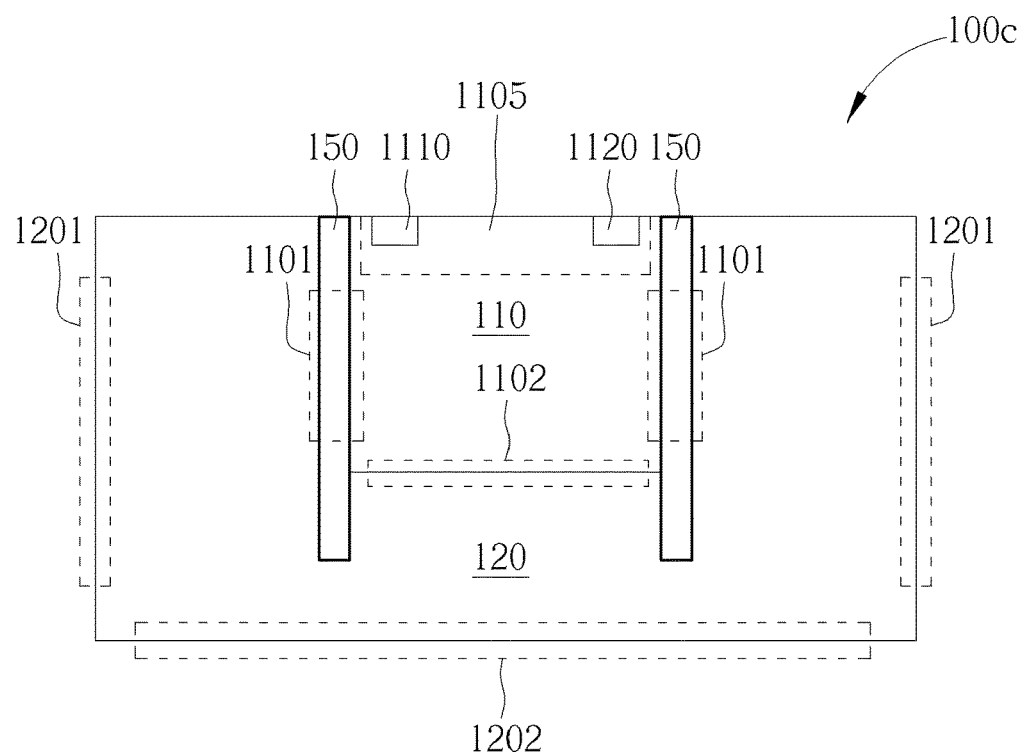
FIG. 7 illustrates a section view of a semiconductor structure according to an embodiment of the present invention.

FIG. 6 illustrates a section view of a semiconductor structure 100b according to an embodiment of the present invention. In FIGS. 1 and 3, the isolation layer 150 is disposed outside the well 110 and on the well 120. However, as shown in FIG. 6, the isolation layer 150 may be disposed inside the well 110. In other words, the isolation layer 150 may be inside a ring shape of the side edge 1101 and the well 110 from a top view. FIG. 7 illustrates a section view of a semiconductor structure 100c according to an embodiment of the present invention. As shown in FIG. 7, the isolation layer 150 may be formed between the well 110 and the well 120, and be in direct contact with the wells 110 and 120.

The parasitic capacitance Cp may occur near boundaries between the well 110 and the well 120 (e.g. the side edge 1101 and the bottom edge 1102). The parasitic resistance Rp may be generated near the boundaries between the well 110 and the well 120, and on the well 110 and/or the well 120. Hence, each of the semiconductor structures shown in FIGS. 1-6 may increase the parasitic resistance, and the layout of the semiconductor structure shown in FIG. 7 may increase the parasitic resistance and decrease the parasitic capacitance. When using one of the semiconductor structures of FIGS. 1-6, the ring structure formed by the isolation layer 150 may have M openings 1501 for applying the foresaid reverse bias voltage when the bottom of the isolation layer 150 is as deep as the well 120 or even deeper. The foresaid isolation layer 150 may be a signal isolation layer in the above example. According to embodiments of the present invention, multiple isolation layers may be disposed inside the well 110, outside the well 110, and/or on the side edge 1101 so as to provide an improved isolation effect.

Figure 8:
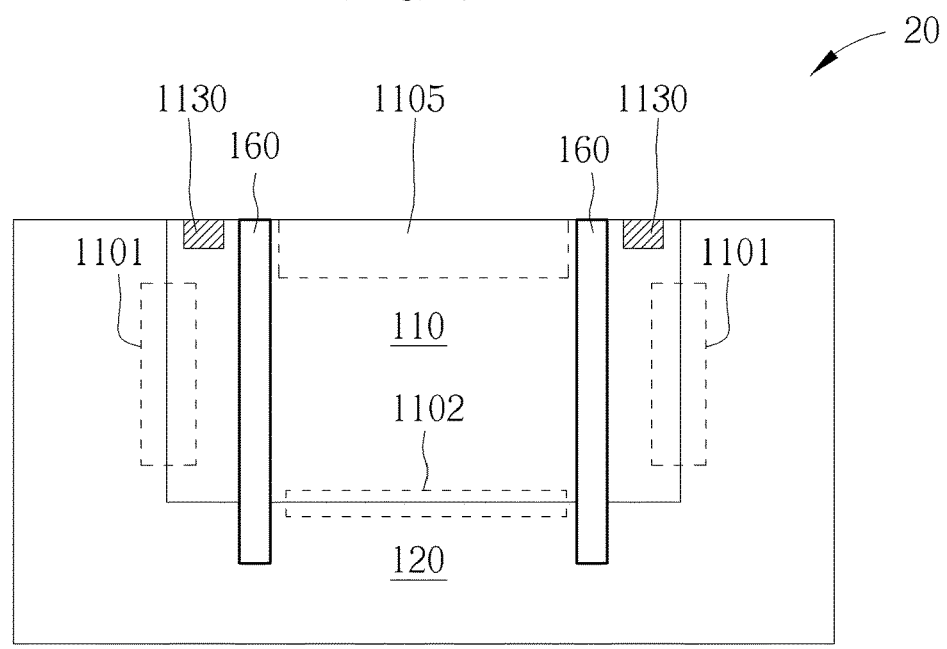
FIG. 8 illustrates a section view of a semiconductor structure according to an embodiment of the present invention.

FIG. 8 illustrates a section view of a semiconductor structure 20 according to an embodiment of the present invention. In addition to the foresaid wells 110-120 and the semiconductor element 1105, the semiconductor structure 20 may further have a heavily-doped region 1130 and an isolation layer 160. The heavily-doped region 1130 may be formed on the well 110, and between the semiconductor element 1105 and the side edge 1101 of the well 110. The isolation layer 160 may be used to reduce a parasitic effect between the heavily-doped region 1130 and the semiconductor element 1105. The isolation layer 160 may be formed between the heavily-doped region 1130 and the semiconductor element 1105. The isolation layer 160 may not be in direct contact with the heavily-doped region 1130 or the semiconductor element 1105 according to an embodiment, and the isolation layer 160 may be in direct contact with the heavily-doped region 1130 and/or the semiconductor element 1105 according to another embodiment. The isolation layer 160 may form a continuous or discontinuous ring structure similar to what described above. Since the isolation layer 160 may be formed by using a deep trench isolation (DTI) process, the bottom of the isolation layer 160 may be deep enough to reach the bottom of the well 110 (e.g. the bottom edge 1102), and the isolation layer 160 may form a discontinuous ring structure with N openings 1601 (shown in following FIG. 10). N may be a positive integer.

Figure 9:
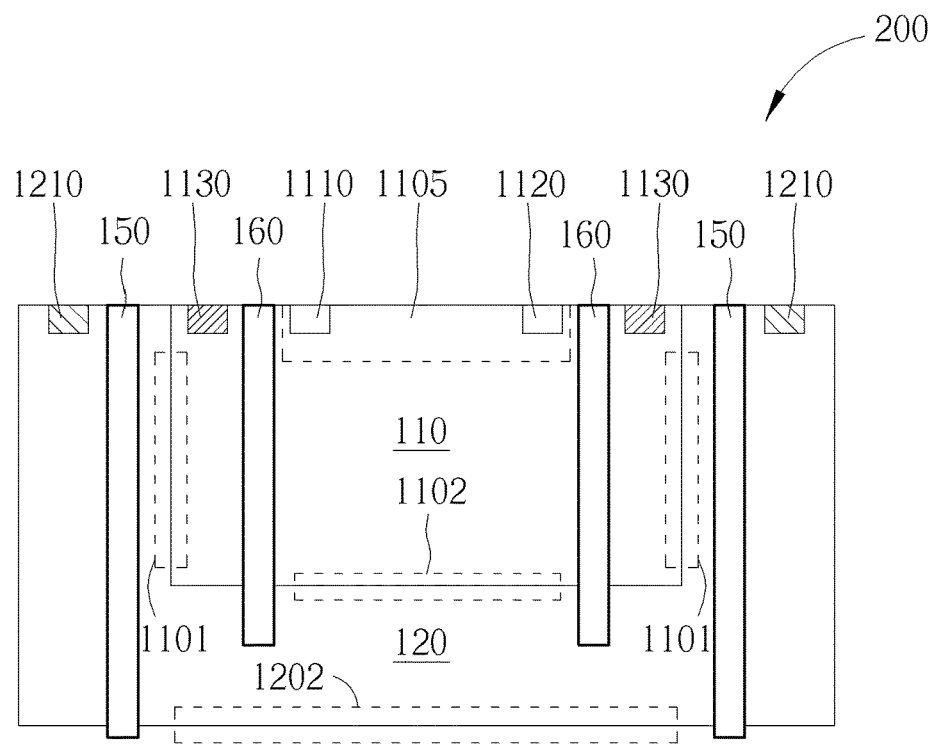
FIG. 9 illustrates a section view of a semiconductor structure according to an embodiment of the present invention.
Figure 10:
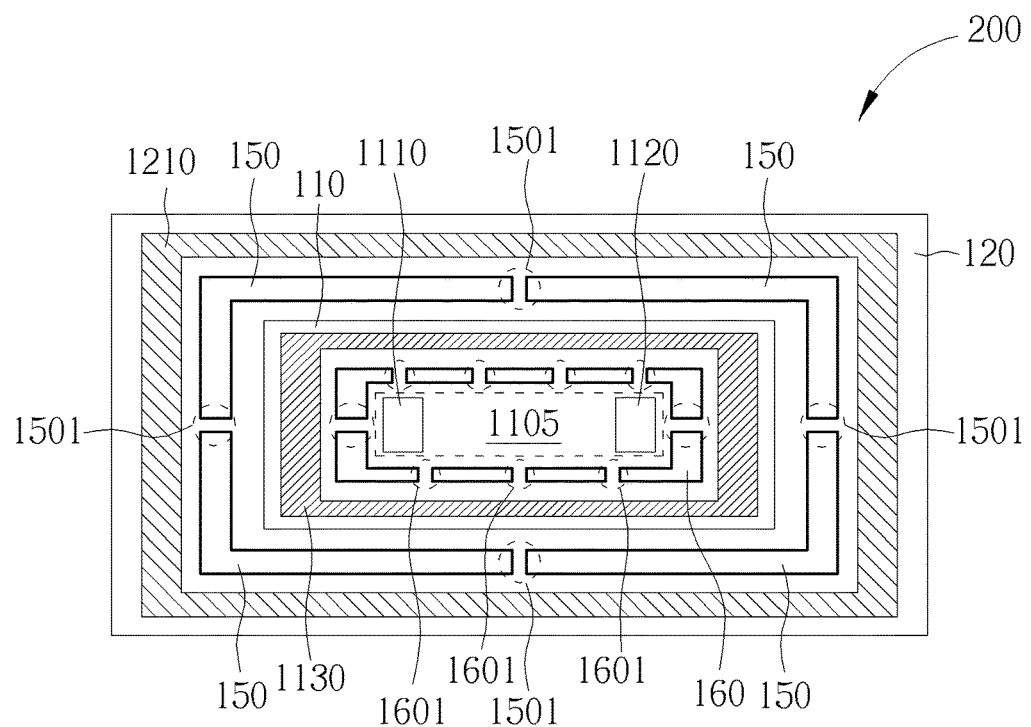
FIG. 10 illustrates a layout diagram seen from a top view of the semiconductor structure of FIG. 9.

FIG. 9 illustrates a section view of a semiconductor structure 200 according to an embodiment of the present invention. FIG. 10 illustrates a layout diagram seen from a top view of the semiconductor structure 200 of FIG. 9. In additional to the well 110, the well 120, the doped region 1110, the doped region 1120, and the isolation layers 150 and 160 described above, the semiconductor structure 200 may further include the heavily-doped region 1130 formed on the well 110, and a heavily-doped region 1210 formed on the well 120. The doped regions 1110 and 1120 and the well 110 may form the semiconductor element 1105 that is a transistor. The heavily-dope regions 1130 and 1210 may be used to apply an external voltage so as to generate a reverse bias voltage. According to an embodiment of the present invention, it is allowed to form and use merely one of the heavily-dope regions 1130 and 1210.

Regarding FIG. 9, the doping types of those regions may be described in table-1. (Table-1 merely provides an example rather than limiting the scope of the present invention.)

TABLE 1

| Processed region | Doping type | Note |
| --- | --- | --- |
| The well 110 | p-type | These regions may form a semiconductor element (e.g. a transistor). |
| The doped region 1110 | n-type | |
| The doped region 1120 | n-type | |
| The well 120 | n-type | |
| The heavily-doped region 1210 | n$^+$-type | Each of the regions may be used to apply a voltage to generate a reverse bias voltage. |
| The heavily-doped region 1130 | p$^+$-type | |

In the example of Table-1, the formed semiconductor element may be an npn transistor. According to another embodiment of the present invention, the p-type doping and n-type doping may be exchanged with one another, and the p$^+$-type doping and n$^+$-type doping may be exchanged with one another so as to form a pnp transistor.

As shown in FIGS. 9-10, the bottom of the isolation layer 150 may be deeper than the bottom edge 1202. Hence, the isolation layer 150 may form a discontinuous ring structure described above to have M openings 1501. The distance from any of the openings 1501 to any of the openings 1601 may be larger than a predetermined distance. This is to increase an equivalent resistance between one opening 1501 and one opening 1601 for a better isolation effect and a smaller parasitic effect. In practice, a checking file such as a script of DRC (design rule check) or LVS (layout versus schematic) may be edited for EDA (electronic design automation) tools to check if the locations of the openings meet the rule. Manual checking may also be performed. In the example of FIG. 10, each of the isolation layers 150 and 160 has openings. However, according to another embodiment of the present invention, it is allowed that only one of the isolation layers 150 and 160 forms a discontinuous ring structure with openings.

Figure 11:
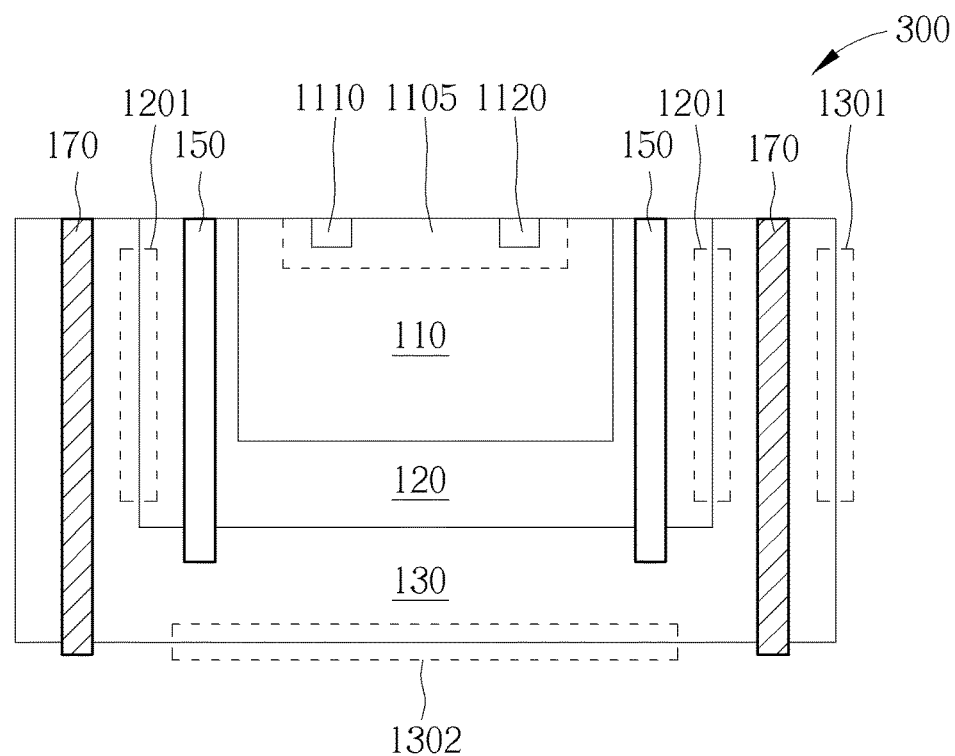
FIG. 11 illustrates a section view of a semiconductor structure according to an embodiment of the present invention.
Figure 12:
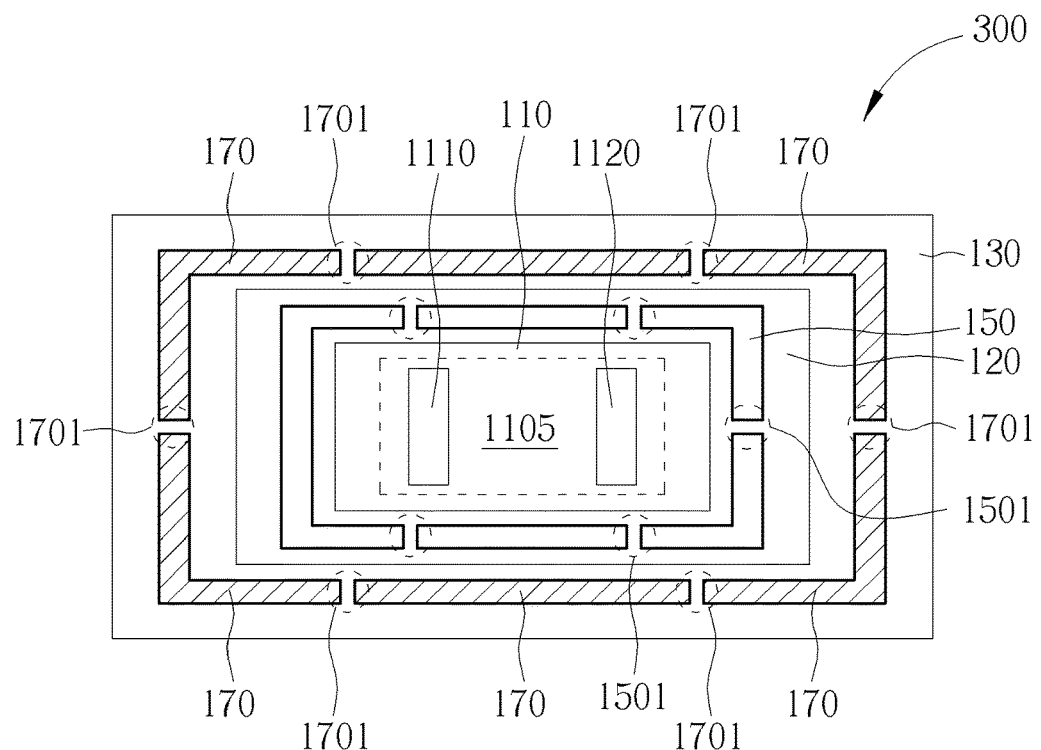
FIG. 12 illustrates a layout diagram of the semiconductor structure of FIG. 11.

FIG. 11 illustrates a section view of a semiconductor structure 300 according to an embodiment of the present invention. FIG. 12 illustrates a layout diagram of the semiconductor structure 300. In addition to the wells 110-120 and the isolation layer 150, the semiconductor structure 300 may further have a third well 130 and an isolation layer 170. The well 130 may be formed outside the well 120, and the well 120 may be formed on the well 130. The isolation layer 170 may be used to reduce a parasitic effect between the well 120 and the well 130. The isolation layer 170 may form a continuous or a discontinuous ring structure along the side edge 1201 of the well 120. The doping type of the well 130 may be different from the doping type of the well 120. The boundary of the well 130 may form a side edge 1301 and a bottom edge 1302 of the well 130. When the bottom of the isolation layer 170 is as deep as the bottom edge 1302 or even deeper, the isolation layer 170 may form a discontinuous ring structure as described above, and the ring structure of the isolation layer 170 may have K openings 1701. K may be a positive integer. Each of the openings 1701 may provide a path of a reverse bias voltage. In FIG. 12, the ring structure of the isolation layer 170 and the openings 1701 are shown. Similarly, a distance between any of the openings 1501 and any of the openings 1701 may be larger than a predetermined distance so as to increase an equivalent resistance, increase an isolation effect and reduce a parasitic effect. The isolation layer 170 may be formed inside the well 120, or outside the well 120 to be formed on the well 130, and used to increase a parasitic resistance. In another example, the isolation layer 170 may be formed between the wells 120 and 130 and be in direct contact with the wells 120 and 130 so as to increase the parasitic resistance and reduce the parasitic capacitance. In another example, when the isolation layer 170 is formed inside or outside the well 120, the isolation layer 170 may not contact the side edge 1201.

Figure 13:
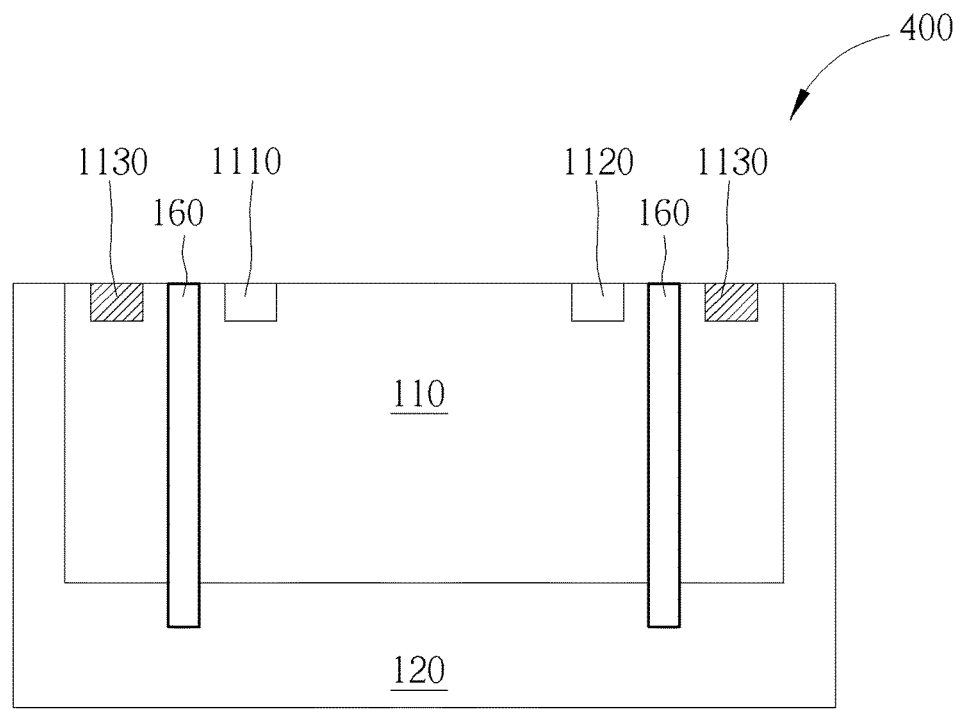
FIGS. 13 to 16 illustrate section views of the semiconductor structures according to four embodiments of the present invention.
Figure 14:
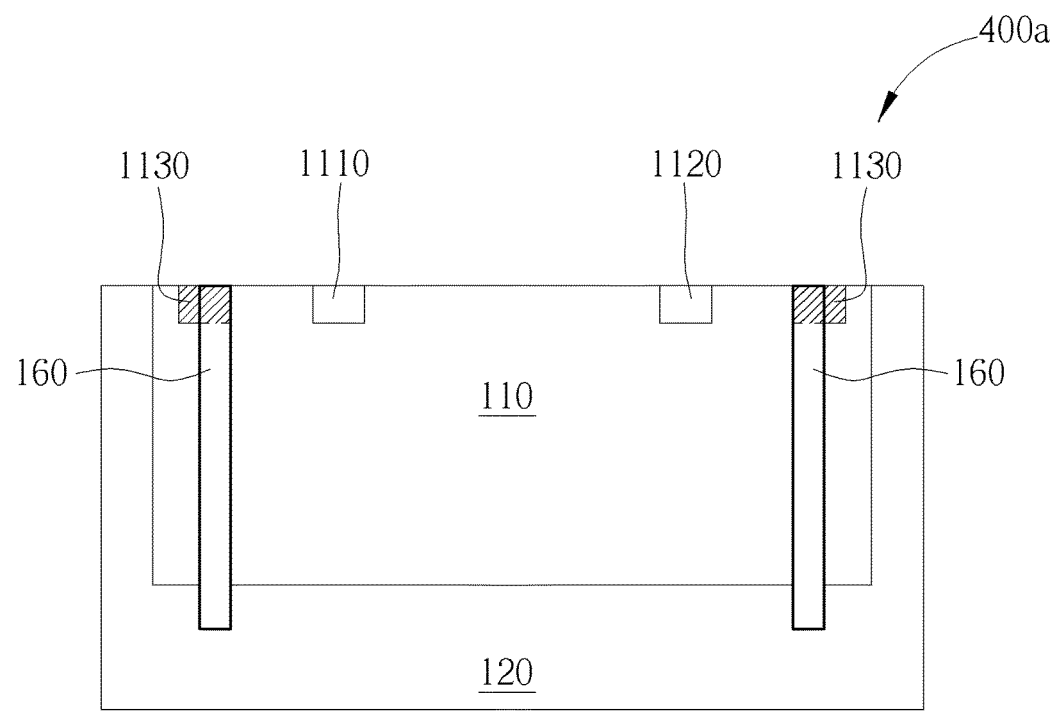
Figure 15:
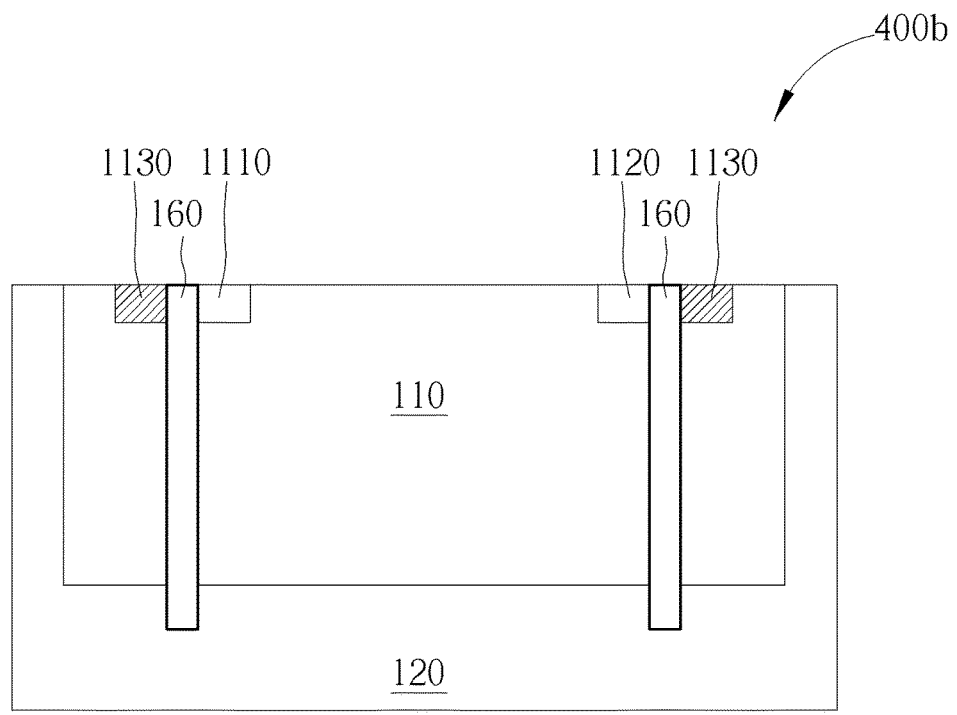
Figure 16:
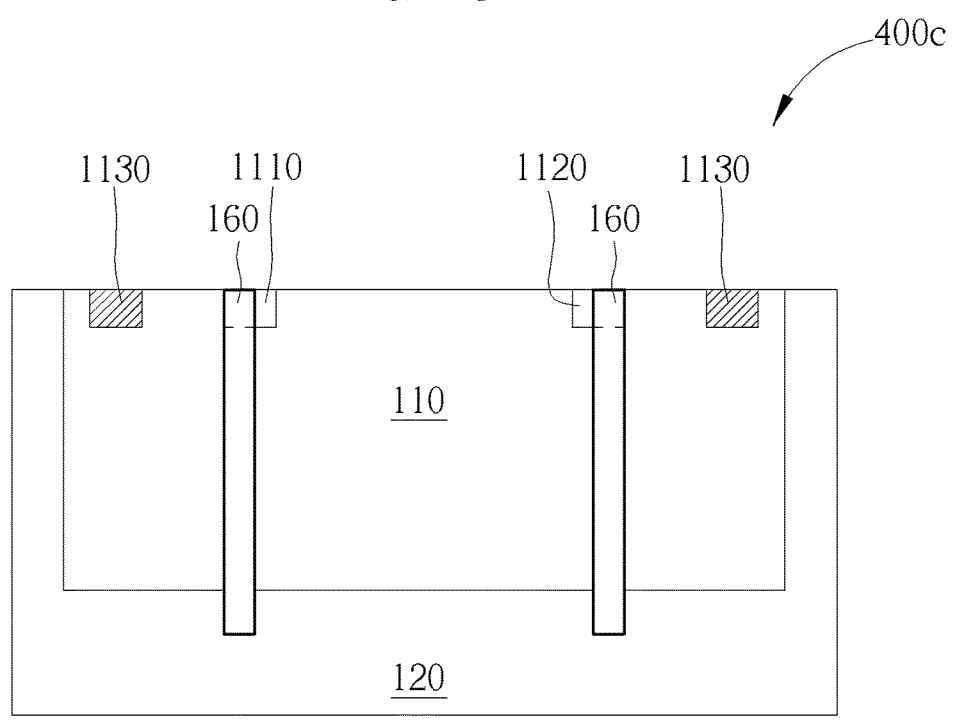

FIGS. 13 to 16 illustrate section views of the semiconductor structures 400, 400a, 400b and 400c according to four embodiments of the present invention. As shown in FIG. 13, the isolation layer 160 may be formed between the doped region 1110 and the heavily-doped region 1130, or between the doped region 1120 and the heavily-doped region 1130 so as to reduce a parasitic effect between the doped region 1110 and the heavily-doped region 1130 or between the doped region 1120 and the heavily-doped region 1130. As shown in FIG. 14, the isolation layer 160 may be in direct contact with the heavily-doped region 1130 without contacting the doped region 1110 and/or the doped region 1120. As shown in FIG. 15, the isolation layer 160 may be formed between the heavily doped region 1130 and the doped region 1110 and be in direct contact with the heavily doped region 1130 and the doped region 1110, and/or the isolation layer 160 may be formed between the heavily doped region 1130 and the doped region 1120 and be in direct contact with the heavily doped region 1130 and the doped region 1120. As shown in FIG. 16, the isolation layer 160 may be formed between the doped region 1110 and the heavily-doped region 1130 and between the doped region 1120 and the heavily-doped region 1130, and be in direct contact with the doped region 1110 and/or the doped region 1120 without contacting the heavily-doped region 1130.

Figure 17:
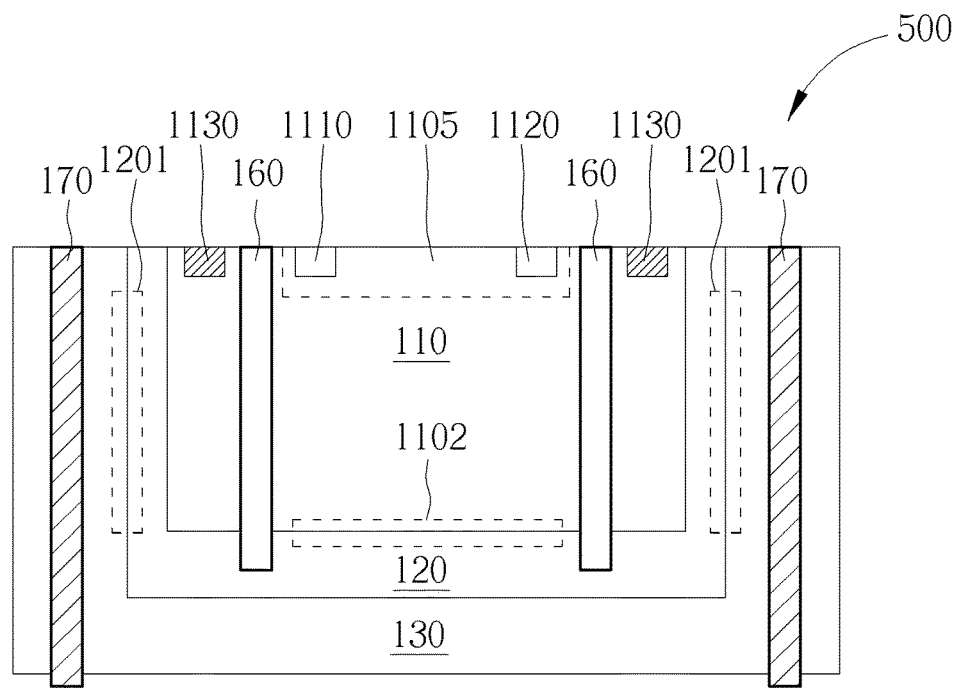
FIG. 17 illustrates a section view of a semiconductor structure according to an embodiment of the present invention.

FIG. 17 illustrates a section view of a semiconductor structure 500 according to an embodiment of the present invention. The semiconductor structure 500 may correspond to embodiments of FIGS. 13 to 16, and further include the well 130 outside the well 120 and the isolation layer 170 to reduce a parasitic effect between the wells 120 and 130. The isolation layer 170 may form a continuous or a discontinuous ring structure around the well 120 along the side edge 1201. The isolation layer 170 may be located on the side edge 1201 and be indirect contact with the wells 120 and 130. In another example, the isolation layer 170 may be formed inside the side edge 1201 to be formed in the well 120, or outside the side edge 1201 to be formed in the well 130. In the example of FIG. 17, the isolation layer 170 is formed outside the side edge 1201 in the well 130.

Figure 18:
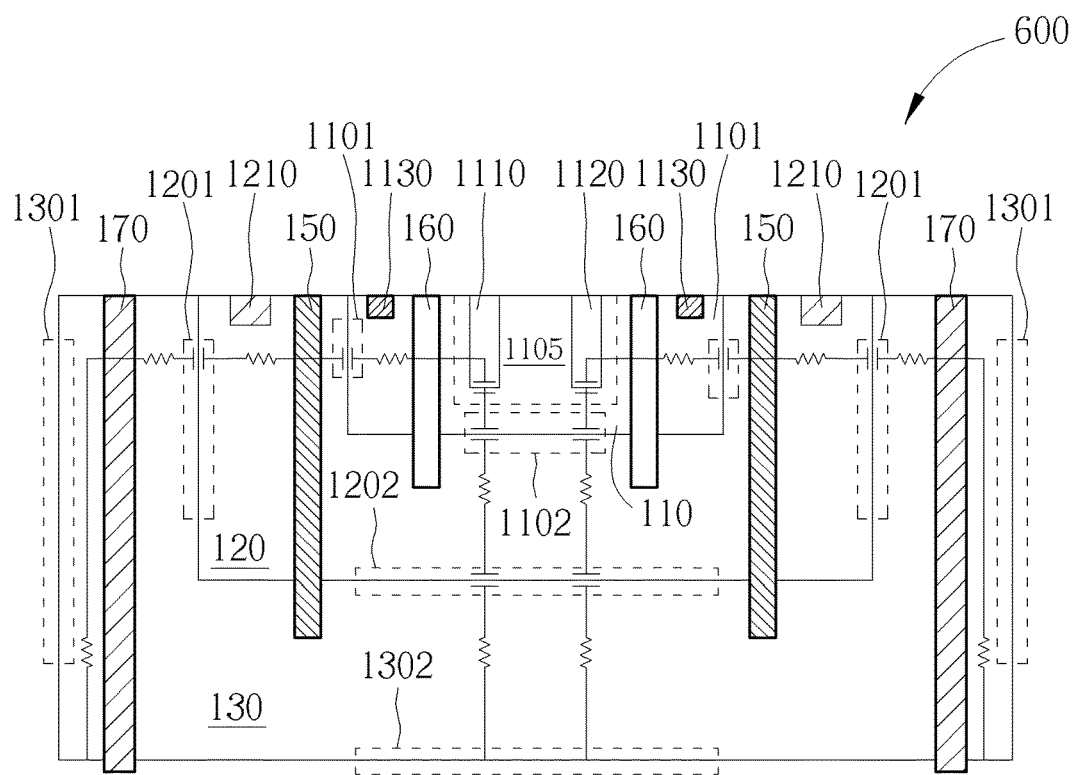
FIG. 18 illustrates a section view of a semiconductor structure according to an embodiment of the present invention.
Figure 19:
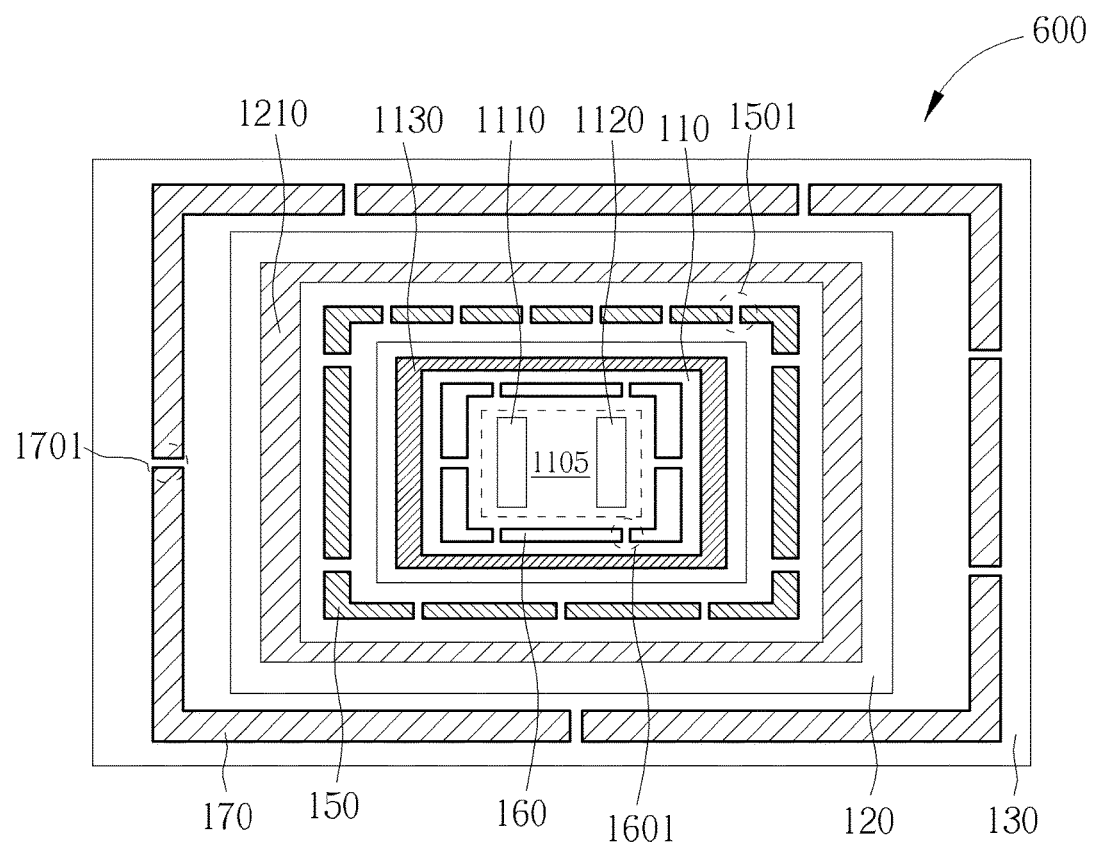
FIG. 19 illustrates a layout diagram of the semiconductor structure of FIG. 18.

FIG. 18 illustrates a section view of a semiconductor structure 600 according to an embodiment of the present invention. FIG. 19 illustrates a layout diagram of the semiconductor structure 600. The semiconductor structure 600 may include the foresaid wells 110, 120 and 130, and the isolation layers 150, 160 and 170 for reducing the parasitic effect between the heavily-doped region 1130 and the doped region 1110, the parasitic effect between the heavily-doped region 1130 and the doped region 1120, and the parasitic effect between any pair of the wells 110 to 130. The said parasitic effect may be described as those parasitic resistances and capacitances drawn in FIG. 18. The isolation layers 150-170 may act as the first, second and third isolation layers. According to the embodiments of FIGS. 2-7 and 9-19, the doped regions 1110-1120 and the well 110 may form a semiconductor element, however, the description above is provided as examples. According to another embodiment of the present invention, it is not limited to form merely two doped regions on the well 110. More doped regions may be formed on the well 110 to act as drain electrodes, source electrodes, gate electrodes or other sorts of electrodes for forming multiple semiconductor elements. According to an embodiment of the present invention, any of the isolation layers 150, 160 and 170 may be formed by using a deep trench isolation (DTI) process rather than a shallow trench isolation (STI) process for improving the effect of repressing unwanted parasitic effects. Each of FIGS. 1-19 may be used to provide an example. When a semiconductor structure includes any of the isolation layers 150-170, and the process to form the isolation layer(s) is a DTI process, the semiconductor structure should be in the scope of the present invention.

In summary, a semiconductor structure including an isolation layer with a sufficient depth can increase a parasitic resistance and decrease a parasitic capacitance so as to reduce a parasitic effect and improve performance of a semiconductor element. Since a ring structure formed by an isolation layer may have openings according to the depth of the isolation layer, a reverse bias voltage may be applied to better reduce the parasitic effect. Hence, the present invention is useful for improving device performance, such as when a semiconductor element operates at a high frequency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a first well;
   a semiconductor element formed on or contacting the first well;
   a second well, the first well being formed within the second well; and
   a first isolation layer configured to reduce a parasitic effect between the first well and the second well, wherein a bottom of the first isolation layer is at least as deep as a bottom of the first well, and the first isolation layer substantially forms a first ring structure along a boundary between the first well and the second well;
   wherein a doping type of the second well is different from a doping type of the first well.

2. The semiconductor structure of claim 1, wherein the bottom of the first isolation layer is slightly shallower than a bottom of the second well.

3. The semiconductor structure of claim 1, wherein the bottom of the first isolation layer is at least as deep as a bottom of the second well, the first ring structure has at least one opening.

4. The semiconductor structure of claim 1, wherein the first isolation layer is formed between the first well and the second well and is in direct contact with the first well and the second well.

5. The semiconductor structure of claim 1, wherein the first isolation layer is formed inside the first well or outside the first well without contacting a side edge of the first well.

6. The semiconductor structure of claim 1, further comprising:
   a heavily-doped region formed on the first well and between the semiconductor element and a side edge of the first well; and
   a second isolation layer formed between the heavily-doped region and the semiconductor element, and configured to reduce a parasitic effect between the heavily-doped region and the semiconductor element, wherein the second isolation layer forms a second ring structure;
   wherein the second ring structure has at least one opening.

7. The semiconductor structure of claim 1 further comprising:
   a first doped region formed on the first well; and
   a second doped region formed on the first well;
   wherein the first doped region, the first well and the second doped region form the semiconductor element, and the semiconductor element is a transistor.

8. The semiconductor structure of claim 7, further comprising:
   a heavily-doped region formed on the first well, between the first doped region and a side edge of the first well, and between the second doped region and the side edge of the first well; and
   a second isolation layer formed between the heavily-doped region and the first doped region and between the heavily-doped region and the second doped region, and configured to reduce a parasitic effect between the heavily-doped region and the first doped region and a parasitic effect between the heavily-doped region and the second doped region, wherein the second isolation layer forms a second ring structure;
   wherein the second ring structure has at least one opening.

9. The semiconductor structure of claim 8, wherein the second isolation layer is in direct contact with the heavily-doped region, the first doped region and/or the second doped region.

10. The semiconductor structure of claim 1, further comprising:
    a third well, wherein the second well is formed within the third well; and
    a third isolation layer configured to reduce a parasitic effect between the second well and the third well, wherein the third isolation layer substantially forms a third ring structure along a side edge of the second well;
    wherein a doping type of the third well is different from the doping type of the second well.

11. The semiconductor structure of claim 10, wherein a bottom of the third isolation layer is at least as deep as a bottom of the third well, the third ring structure has at least one opening.

12. A semiconductor structure, comprising:
    a first well;
    a semiconductor element formed on or contacting the first well;

a second well, the first well being formed within the second well;

a heavily-doped region formed on the first well, and between the semiconductor element and a side edge of the first well; and a second isolation layer configured to reduce a parasitic effect between the heavily-doped region and the semiconductor element, and form a second ring structure along a boundary between the first well and the second well, wherein a bottom of the second isolation layer is at least as deep as a bottom of the first well;

wherein the second ring structure has at least one opening, and a doping type of the second well is different from a doping type of the first well.

13. The semiconductor structure of claim 12, further comprising:

a first doped region formed on the first well;

a second doped region formed on the first well, and configured to form the semiconductor element with the first well and the first doped region;

wherein the heavily-doped region is formed between the first doped region and the side edge of the first well, and between the second doped region and the side edge of the first well, and the second isolation layer is configured to reduce a parasitic effect between the heavily-doped region and the first doped region and/or between the heavily-doped region and the second doped region.

14. The semiconductor structure of claim 13, wherein:

the second isolation layer is in direct contact with the heavily-doped region without contacting the first doped region and/or the second doped region.

15. The semiconductor structure of claim 13, wherein:

the second isolation layer is in direct contact with the first doped region and/or the second doped region without contacting the heavily-doped region.

16. The semiconductor structure of claim 13, wherein:

the second isolation layer is formed between the heavily-doped region and the first doped region and is in direct contact with the heavily-doped region and the first doped region.

17. The semiconductor structure of claim 13, wherein:

the second isolation layer is formed between the heavily-doped region and the second doped region and is in direct contact with the heavily-doped region and the second doped region.

* * * * *